(12) United States Patent
Ling et al.

(10) Patent No.: US 10,437,366 B1
(45) Date of Patent: Oct. 8, 2019

(54) DISPLAY MODULE AND USING METHOD THEROF

(71) Applicant: Shanghai Oxi Technology Co., Ltd., Shanghai (CN)

(72) Inventors: Yan Ling, Shanghai (CN); Hong Zhu, Shanghai (CN)

(73) Assignee: Shanghai Oxi Technology Co., Ltd, Shanghai (CN)

( * ) Notice: Subject to any disclaimer, the term of this patent is extended or adjusted under 35 U.S.C. 154(b) by 93 days.

(21) Appl. No.: 15/758,030

(22) PCT Filed: Feb. 15, 2017

(86) PCT No.: PCT/CN2017/073610
§ 371 (c)(1),
(2) Date: Mar. 7, 2018

(87) PCT Pub. No.: WO2018/103194
PCT Pub. Date: Jun. 14, 2018

(30) Foreign Application Priority Data

Dec. 9, 2016 (CN) .......................... 2016 1 1131143

(51) Int. Cl.
*G06F 3/041* (2006.01)
*G09G 3/32* (2016.01)
(Continued)

(52) U.S. Cl.
CPC .......... *G06F 3/0412* (2013.01); *G06K 9/0002* (2013.01); *G09G 3/2003* (2013.01); *G09G 3/32* (2013.01)

(58) Field of Classification Search
CPC ...... G06F 3/0412; G06F 21/32; G06F 3/0421; G06F 2203/0338; G06F 2203/04104;
(Continued)

(56) References Cited

U.S. PATENT DOCUMENTS

2005/0213173 A1 9/2005 Sasaki
2011/0227873 A1* 9/2011 Chung ................ G02F 1/13338
345/175
(Continued)

FOREIGN PATENT DOCUMENTS

CN 1674038 A 9/2005
CN 103700692 4/2014
(Continued)

OTHER PUBLICATIONS

International Search Report and Written Opinion from PCT/CN2017/073610, dated Aug. 29, 2017, with certified English translation.
(Continued)

*Primary Examiner* — Premal R Patel
(74) *Attorney, Agent, or Firm* — Adsero IP

(57) ABSTRACT

Display module and using method thereof are provided. The display module includes: a self-luminous display panel including first and second substrates and a self-luminous circuit layer, the self-luminous circuit layer being disposed between the first and second substrates, and including multiple display pixel units each of which includes at least one light blocking region and non-opaque region; an optical fingerprint sensor below the second substrate and including a fingerprint sensing circuit layer and a third substrate which is non-opaque, the fingerprint sensing circuit layer including multiple photosensitive pixel units each of which includes a non-opaque region and a light blocking region where a photosensitive element of the photosensitive pixel unit is disposed; a point-shaped backlight source below the optical fingerprint sensor, light emitted from the point-shaped backlight source entering the optical fingerprint sensor with first incident angle which is acute. Fingerprint recognition function is well integrated in the display module.

14 Claims, 1 Drawing Sheet

(51) Int. Cl.
*G06K 9/00* (2006.01)
*G09G 3/20* (2006.01)

(58) Field of Classification Search
CPC ...... G09G 3/32; G09G 3/2003; G06K 9/0002; G06K 9/00073; G06K 9/001
See application file for complete search history.

(56) References Cited

U.S. PATENT DOCUMENTS

| | | |
|---|---|---|
| 2015/0357384 A1 | 12/2015 | Li |
| 2016/0266695 A1 | 9/2016 | Bae et al. |
| 2017/0012085 A1 | 1/2017 | Lee |
| 2017/0220839 A1 | 8/2017 | Yang et al. |
| 2017/0221972 A1 | 8/2017 | Yang et al. |
| 2017/0270340 A1 | 9/2017 | Gao |
| 2018/0005007 A1* | 1/2018 | Du .................. H01L 27/3262 |
| 2018/0150671 A1* | 5/2018 | Choo .................. G06F 3/0412 |
| 2018/0254288 A1 | 9/2018 | Ling |

FOREIGN PATENT DOCUMENTS

| | | |
|---|---|---|
| CN | 104659075 A | 5/2015 |
| CN | 105047689 A | 11/2015 |
| CN | 105095877 A | 11/2015 |
| CN | 105184282 A | 12/2015 |
| CN | 105261714 A | 1/2016 |
| CN | 105550664 A | 5/2016 |
| CN | 105678255 A | 6/2016 |
| CN | 106022325 A | 10/2016 |
| CN | 106024833 A | 10/2016 |
| CN | 106096595 A | 11/2016 |
| CN | 106156753 A | 11/2016 |
| CN | 106169484 A | 11/2016 |
| CN | 106203408 A | 12/2016 |

OTHER PUBLICATIONS

Office Action from Chinese App. No. 201611131143.1 dated Mar. 22, 2019 (with English Translation).

* cited by examiner

DISPLAY MODULE AND USING METHOD THEROF

CROSS-REFERENCE TO RELATED APPLICATIONS

This application is the national phase of International Application No. PCT/CN2017/073610, filed on Feb. 15, 2017, which claims the benefit of priority to Chinese Patent Application No. 201611131143.1, filed on Dec. 9, 2016, and entitled "DISPLAY MODULE AND USING METHOD THEREOF", the entire disclosure of which are incorporated herein by reference.

TECHNICAL FIELD

The present disclosure generally relates to optical fingerprint recognition field, and more particularly, to a display module and a using method thereof.

BACKGROUND

Fingerprint imaging recognition technology is used to realize identification by capturing fingerprint images of a person using optical fingerprint sensors and then determining whether the fingerprint images match those stored in a system before. Due to its convenience in use and uniqueness of human fingerprints, the fingerprint recognition technology has been widely applied to various fields, such as safety inspection field (for example, public security bureau or customs), entrance guard systems in buildings or consumption goods field (for example, personal computers or mobile phones).

The fingerprint recognition technology includes optical imaging, capacitive imaging, ultrasonic imaging and the like, among which, the optical fingerprint recognition technology is advantageous in imaging quality and device cost.

Organic Light Emitting Diode (OLED) display module is one of the hot areas in the field of flat panel display. OLED display modules have been widely used in mobile phones, computers, digital cameras and other electronic products due to their low power consumption, wide color gamut, self-luminous feature, wide viewing angle, fast response, etc.

In exiting techniques, capacitive fingerprint imaging technology is always applied in OLED display modules. More information about integrating a fingerprint recognition function in display modules can be found in the Chinese patent application with publication number CN106024833A.

However, structures and functions of existing display modules with a fingerprint recognition function need to be improved.

SUMMARY

In embodiments of the present disclosure, a display module is provided to better integrate a fingerprint recognition function in the display module, so that not only a display function is provided, but also relatively clear fingerprint images are obtained.

In an embodiment of the present disclosure, a display module is provided, including: a self-luminous display panel which includes a first substrate, a second substrate and a self-luminous circuit layer, wherein the self-luminous circuit layer is disposed between the first substrate and the second substrate, and includes a plurality of display pixel units, and each of the plurality of display pixel units includes at least one light blocking region and at least one non-opaque region; an optical fingerprint sensor disposed below the second substrate, wherein the optical fingerprint sensor includes a fingerprint sensing circuit layer and a third substrate, the third substrate includes a non-opaque material, the fingerprint sensing circuit layer includes a plurality of photosensitive pixel units, and each of the plurality of photosensitive pixel units includes a non-opaque region and a light blocking region in which a photosensitive element of the photosensitive pixel unit is disposed; and a point-shaped backlight source disposed below the optical fingerprint sensor. wherein light emitted from the point-shaped backlight source enters the optical fingerprint sensor with a first incident angle which is acute.

Optionally, the display module may further include a protective layer disposed on the first substrate.

Optionally, a light anti-reflection layer may be disposed below the second substrate, and a non-opaque adhesive layer may be disposed between the light anti-reflection layer and the point-shaped backlight source.

Optionally, a non-opaque dielectric layer may be disposed between the optical fingerprint sensor and the point-shaped backlight source, and the light emitted from the point-shaped backlight source enters the non-opaque dielectric layer and then enters the optical fingerprint sensor.

Optionally, a lower surface of the non-opaque dielectric layer may be a light focusing surface, and the light emitted from the point-shaped backlight source enters the non-opaque dielectric layer from the light focusing surface which focuses the light emitted from the point-shaped backlight source into parallel light or near-parallel light.

Optionally, a light focusing lens may be disposed in front of a light emitting surface of the point-shaped backlight source, the light focusing lens may be capable of focusing the light emitted from the point-shaped backlight source into parallel light or near-parallel light, and the light emitted from the backlight source enters the light focusing lens and then enters the optical fingerprint sensor.

Optionally, an optical adhesive layer may be disposed between the self-luminous display panel and the optical fingerprint sensor.

Optionally, an optical adhesive layer may be disposed between the self-luminous display panel and the protective layer.

Optionally, the point-shaped backlight source may include one Light Emitting Diode (LED), and light of the LED is near-ultraviolet light, purple light, blue light, green light, yellow light, red light, near-infrared light or white light; or, the point-shaped backlight source may include at least two LEDs which are evenly arranged below the optical fingerprint sensor, and light of the LEDs may be near-ultraviolet light, purple light, blue light, green light, yellow light, red light, near-infrared light or white light.

In an embodiment of the present disclosure, a method for using a display module which includes a self-luminous display panel, an optical fingerprint sensor and a point-shaped backlight source is provided, wherein the self-luminous display panel includes a first substrate, a second substrate and a self-luminous circuit layer, the self-luminous circuit layer is disposed between the first substrate and the second substrate, and includes a plurality of display pixel units, each of the plurality of display pixel units includes at least one light blocking region and at least one non-opaque region, the optical fingerprint sensor is disposed below the second substrate, and includes a fingerprint sensing circuit layer and a third substrate, the third substrate includes a non-opaque material, the fingerprint sensing circuit layer includes a plurality of photosensitive pixel units, each of the plurality of photosensitive pixel units includes a non-opaque region and a light blocking region in which a photosensitive element of the photosensitive pixel unit is disposed, the point-shaped backlight source is disposed below the optical fingerprint sensor, and light emitted from the point-shaped backlight source enters the optical fingerprint sensor with a first incident angle which is acute, wherein the method includes: defining a display area of the self-luminous display panel which faces the optical fingerprint sensor as a first display area, and other display areas of the self-luminous display panel as a second display area; and when the optical fingerprint sensor performs fingerprint image acquisition, controlling the first display area to stop displaying.

Optionally, the method may further include: when the optical fingerprint sensor performs fingerprint image acquisition, controlling the second display area to display information associated with the fingerprint image acquisition.

Embodiments of the present disclosure may provide following advantages. In embodiments of the present disclosure, the optical fingerprint sensor is disposed below the second substrate of the self-luminous display panel, the point-shaped backlight source is disposed below the optical fingerprint sensor, and the self-luminous display panel is provided with the non-opaque region. Therefore, the light emitted from the point-shaped backlight source passes back and forth through the self-luminous display panel, which realizes acquiring fingerprint images using the display module. Besides, the acquired fingerprint images are clear, which makes the display module be integrated with a good fingerprint recognition function.

In embodiments of the present disclosure, during a process of using the display module, when the optical fingerprint sensor performs fingerprint image acquisition, the first display area which faces the optical fingerprint sensor is controlled to stop displaying, and the second display area is controlled to display information associated with the fingerprint image acquisition. In this way, a display function cooperates with a fingerprint recognition function, so as to provide better user experience.

DETAILED DESCRIPTION

As described in the background, capacitive fingerprint imaging technology is always applied in OLED display modules.

Therefore, embodiments of the present disclosure provide a display module. An optical fingerprint sensor and a self-luminous display panel are integrated together, so as to realize both a display function and a fingerprint recognition function. In addition, corresponding structural design enables the display module to acquire clear fingerprint images, and makes the display function and the fingerprint recognition function cooperate with each other, so as to provide better use experience of the display module.

In order to clarify the object, characteristic and advantages of embodiments of the present disclosure, embodiments of present disclosure will be described clearly in detail in conjunction with accompanying drawings.

Figure 1:
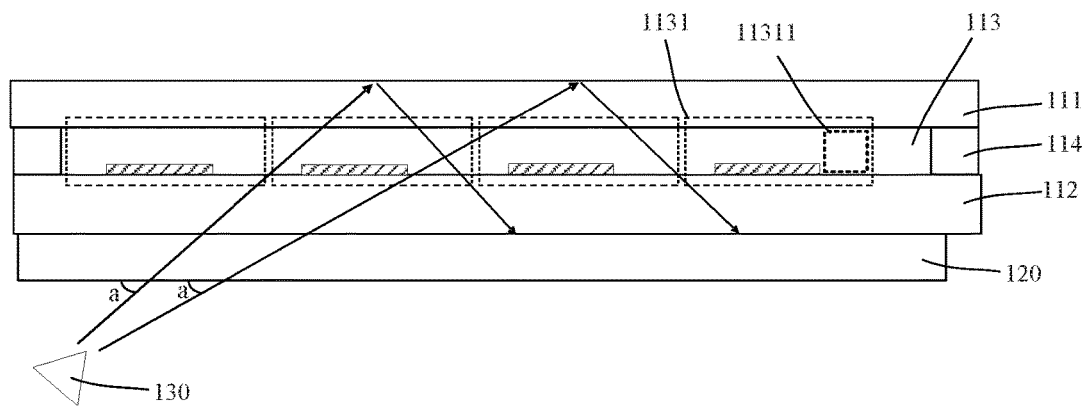
FIG. 1 schematically illustrates a sectional view of a display module according to an embodiment.

In an embodiment, a display module is provided. FIG. 1 schematically illustrates a sectional view of the display module.

The display module includes a self-luminous display panel (not shown), an optical fingerprint sensor 120 and a point-shaped backlight source 130.

The self-luminous display panel includes a first substrate 111, a second substrate 112 and a self-luminous circuit layer 113. The self-luminous circuit layer 113 is disposed between the first substrate 111 and the second substrate 112. The self-luminous display panel further includes a sealing structure 114 which is also disposed between the first substrate 111 and the second substrate 112. The sealing structure 114 keeps the self-luminous circuit layer 113 to be sealed between the first substrate 111 and the second substrate 112.

In some embodiments, the first substrate 111 and the second substrate 112 may include a non-opaque material, such as inorganic glass, organic glass, or other organic non-opaque resin.

The self-luminous circuit layer 113 includes a plurality of display pixel units 1131 (in FIG. 1, the display pixel units 1131 and relations between display pixel units 1131 are shown with dotted boxes. It should be noted that, the dotted boxes include a portion of the first substrate 111 and the second substrate 112 therein for illustration purpose. In fact, the display pixel units 1131 do not include the first substrate 111 and the second substrate 112). Each of the plurality of display pixel units 1131 includes at least one light blocking region and at least one non-opaque region 11311. One non-opaque region 11311 is shown in FIG. 1. Specifically, an area where one non-opaque region 11311 is disposed is shown as an area enclosed by the smallest dotted box in FIG. 1.

It should be noted that, in some embodiments, the non-opaque region 11311 of one display pixel unit 1131 may be connected with the non-opaque region 11311 of another display pixel unit 1131 to form a non-opaque region with a larger area. In this situation, the two display pixel units 1131 are usually adjacent. And an area between the two display pixel units 1131 is also a non-opaque region, so that the three non-opaque regions may be connected together to be a larger non-opaque region.

In some embodiments, the self-luminous display panel is an OLED display panel. The display pixel unit 1131 of the self-luminous circuit layer 113 may include an anode layer, a hole injection layer (HIL), a light emitting layer (EML), an electron injection layer (EIL) and a cathode layer, and may also include a hole transport layer (HTL) and an electron transport layer (ETL), and may also include a Thin Film Transistor (TFT) for driving OLED, driving metal lines, a storage capacitor and the like. Light emitting theory of the OLED display panel includes: under the driving of a certain voltage, electrons and holes respectively migrating from the cathode layer and the anode layer to the light-emitting layer, and meeting in the light-emitting layer to form excitons which excite light-emitting molecules; and the light-emitting molecules are subjected to radiation relaxation to emit visible light (or other light). The above structures, such as the light-emitting layer, are located in a corresponding light blocking region. In the periphery of the light blocking region, the display pixel unit 1131 has the corresponding non-opaque region 11311.

In some embodiments, the self-luminous circuit layer 113 is formed on the second substrate 112 with a gap layer between the self-luminous circuit layer 113 and the first substrate 111. The gap layer is filled with an inert gas, such as nitrogen gas or argon gas, so as to protect the self-luminous circuit layer 113 from being crushed by the first substrate 111.

In some embodiments, height of the non-opaque region 11311 is equal to height of the self-luminous circuit layer 113, as shown in FIG. 1, so as to ensure that light can pass through the self-luminous circuit layer 113 from the non-opaque region 11311 (it should be noted that, the self-luminous circuit layer 113 may be slightly different in height at different portions, and at least the height of some portions of the self-luminous circuit layer 113 is equal to the height of the non-opaque region 11311), which ensures that the display module can acquire fingerprint images. As the gap layer is disposed between the self-luminous circuit layer 113 and the first substrate 111, the light passes through the second substrate 112, the non-opaque region 11311, the gap layer and the first substrate 111 when passing through the self-luminous display panel.

Specifically, the light blocking region of one display pixel unit 1131 has semiconductor layer structures, such as a light-emitting layer, which need to be light-shielded and are thus formed in the light blocking region, and other positions of the display pixel unit 1131 may be provided with the non-opaque region. That is, on the basis of ensuring corresponding structures and functions, other structures of the display pixel unit 1131 can be made using a non-opaque structure as much as possible. In addition, structures between adjacent display pixel units 1131 may also be made using a non-opaque structure as much as possible. In addition, at areas outside of a display area where the display pixel units 1131 are located, for example, a manufacturing position of structures like a driving circuit and a bonding pin, a non-opaque region may also be provided, so that more light can pass through the OLED display panel (passing through is generally referred to as passing through the height of the display pixel unit 1131, height also being generally referred to as thickness).

Referring to FIG. 1, the optical fingerprint sensor 120 is disposed below the second substrate 112. That is, the optical fingerprint sensor 120 is disposed below the self-luminous display panel.

The optical fingerprint sensor 120 includes a fingerprint sensing circuit layer (not shown) and a third substrate (not shown) which is non-opaque. In some embodiments, the fingerprint sensing circuit layer is disposed between the second substrate 112 and the third substrate. The optical fingerprint sensor 120 may be a glass-substrate-based image sensor formed by a Thin Film Transistor (TFT) process, that is, the third substrate may include glass. In some embodiments, the third substrate is disposed between the second substrate 112 and the fingerprint sensing circuit layer. The third substrate is also made of a non-opaque material. The optical fingerprint sensor 120 may be a back-illuminated image sensor, for example, a back-illuminated image sensor formed by a TFT process.

The fingerprint sensing circuit layer of the optical fingerprint sensor 120 includes a plurality of photosensitive pixel units (not shown). Each of the plurality of photosensitive pixel units includes a non-opaque region and a light blocking region. A photosensitive element of the photosensitive pixel unit, such as a photosensitive diode, is disposed in the light blocking region.

In some embodiments, a first incident angle is shown as an angle a in FIG. 1. Light emitted from the point-shaped backlight source 130 enters the optical fingerprint sensor 120 with the first incident angle (for simplification, refraction of light, such as the refraction that occurs when light enters the optical fingerprint sensor 120 or the refraction that occurs when light enters the second substrate 112, is omitted in FIG. 1). Generally, the angle a can be controlled below 45 degrees, for example, between 5 degrees and 45 degrees, so as to make the display module have a good fingerprint identification function. Detailed reasons are described below.

In some embodiments, the point-shaped backlight source 130 is disposed below the optical fingerprint sensor 120, and the light emitted from the point-shaped backlight source 130 enters the optical fingerprint sensor 120 with the first incident angle, so that the light emitted from the point-shaped backlight source 130 and used for fingerprint image acquisition enters the second substrate 112 with an oblique incident angle. The light will continue to pass through the self-luminous circuit layer 113 with an oblique incident angle so as to obliquely radiate into the first substrate 111. Moreover, the light undergoes optical phenomena, such as reflection and refraction, at the interface between a finger and an upper surface of the first substrate 111 to generate corresponding reflected light. It can be known from theory of optical propagation that the reflected light generally returns obliquely downward back to the first substrate 111 with an oblique incident angle. The reflected light continues to pass obliquely downward through the self-luminous circuit layer 113 with an oblique angle, so as to obliquely radiate into the second substrate 112 and then continues to radiate obliquely downward with an oblique incident angle to reach the optical fingerprint sensor 120 and be received by the photosensitive pixel unit in the optical fingerprint sensor 120. Compared with a surface light source using the light guide plate, the point-shaped backlight source 130 can make the light shift towards a same direction (while light of the light guide plate is disorderly and shifts towards different directions), which avoids crosstalk of light (while the light from the light guide plate has crosstalk with each other). Besides, offsets of light at similar positions relative to the point-shaped backlight source 130 are similar, so that a relatively clear fingerprint image may be obtained. In this way, fingerprint recognition performance of the display module may be improved. Besides, when the light enters the optical fingerprint sensor 120 with the first incident angle which is acute, the fingerprint image may be clearer.

In addition, as no extra structure is disposed between the point-shaped backlight source 130 and the second substrate 112 of the optical fingerprint sensor 120 (for example, a non-opaque adhesive layer or other non-opaque dielectric layer is not employed), the whole display module has a simple structure, a simple manufacturing process and relatively small thickness. Further, as the oblique incident light is refracted, even if an angular difference between light originally emitted by the point-shaped backlight source 130 is large, its refracted light has a reduced angular difference with each other once entering a light propagation medium having a refractive index greater than 1, such as the second substrate 112. The reduction of the angular difference remains until the light is received by the optical fingerprint sensor 120, so that the acquired fingerprint image is less distorted and thus has better quality.

In some embodiments, the point-shaped backlight source 130 may include one LED, and light of the LED is near-ultraviolet light, purple light, blue light, green light, yellow light, red light, near-infrared light or white light.

In some embodiments, an optical adhesive layer (not shown) may be disposed between the self-luminous display panel and the optical fingerprint sensor 120. The optical adhesive layer may be a thermal optical adhesive layer, a photosensitive optical adhesive layer or an optical double-sided adhesive tape. The optical adhesive layer prevents the presence of air between the self-luminous display panel and the optical fingerprint sensor 120 to further improve optical performance of the display module.

In some embodiments, the self-luminous display panel and the optical fingerprint sensor 120 may be directly laminated, that is, the optical fingerprint sensor 120 and the self-luminous display panel are at least partially in contact with each other. When the optical fingerprint sensor 120 and the self-luminous display panel are overall of a flat structure with a flat top and bottom, the optical fingerprint sensor 120 and the self-luminous display panel may be exactly the laminated configuration as shown in FIG. 1.

It should be noted that, in some embodiments, when the OLED display panel is directly laminated with the optical fingerprint sensor 120 or attached with the optical adhesive layer, a distance between the photosensitive pixel unit of the optical fingerprint sensor 120 and the upper surface of the first substrate 11l is relatively small, so that quality of the acquired fingerprint image meets requirements.

In some embodiments, an area of the display pixel unit 1131 in the OLED display panel is less than or equal to an area of the photosensitive pixel unit in the optical fingerprint sensor 120.

Based on the above area comparison, in some embodiments, one photosensitive pixel unit in the optical fingerprint sensor 120 and one display pixel unit 1131 in the OLED display panel may be corresponding to each other to better ensure subsequent fingerprint image acquisition. Specifically, one photosensitive pixel unit may face one display pixel unit 1131, and the area of the photosensitive pixel unit is equal to the area of the display pixel unit 1131. The non-opaque region 11311 of the display pixel unit 1131 at least corresponds to the photosensitive element of the photosensitive pixel unit. As the area of the photosensitive pixel unit is equal to the area of the display pixel unit 1131, the photosensitive pixel units and the display pixel units 1131 may not be aligned one by one, and may have some misalignment with each other. In a macroscopic view, each photosensitive pixel unit corresponds to one display pixel unit 1131, so that the transmitted (reflected) optical signal received by each photosensitive pixel unit is uniform.

Based on the above area comparison, in some embodiments, multiple display pixel units 1131 may correspond to one photosensitive pixel unit. That is, one photosensitive pixel unit may correspond to two or more display pixel units 1131 (i.e., the area of the photosensitive pixel unit is smaller than the area of the display pixel unit 1131). In a macroscopic view, each photosensitive pixel unit corresponds to two or more display pixel units 1131, so that the transmitted (reflected) optical signal received by each photosensitive pixel unit is uniform.

Fingerprint acquisition theory of the display module provided in the embodiment during includes: the light emitted by the point-shaped backlight source 130 entering the optical fingerprint sensor 120 with a first incident angle which is acute, then passing through the optical fingerprint sensor 120 to radiate obliquely upward to enter the second substrate 112, then entering the non-opaque region 11311 of the self-luminous circuit layer 113 from the second substrate 112, and then passing obliquely upward from the light-transmitting region 11311 through the self-luminous circuit layer 113 to enter the first substrate 111. In some embodiments, the first substrate 111 is directly used for contact or press of a fingerprint. Therefore, the light may undergo various types of optic phenomenon, such as refraction, reflection or absorption, at the interface between the upper surface of the first substrate 111 and the finger. Accordingly, there may be some reflected light. The reflected light returns back to the first substrate 111, then radiates obliquely downward from the first substrate 111 to enter the non-opaque region 11311 of the self-luminous circuit layer 113, then passes obliquely downward from the non-opaque region 11311 through the self-luminous circuit layer 113 to enter the second substrate 112, and then enters the fingerprint sensing circuit layer of the optical fingerprint sensor 120 from the second substrate 112 to be received by each photosensitive pixel unit in the fingerprint sensing circuit (specifically, absorbed by the photosensitive element in the photosensitive pixel unit). The received light is subjected to signal processing to achieve corresponding fingerprint image acquisition. Details of the above process may refer to black arrows (not marked) in FIG. 1 which represent the light, where a refraction process of the light is omitted.

In the above process, as the light emitted from the point-shaped backlight source 130 enters the optical fingerprint sensor 120 with the first incident angle which is acute, the incident angle of the light on the lower surface of the second substrate 112 is also acute. When the light is reflected back, the incident angle of the reflected light on the upper surface of the fingerprint sensing circuit layer is also acute. Therefore, the light emitted by the point-shaped backlight source 130 can generate a fingerprint image according to a corresponding offset. The optical fingerprint sensor 120 can realize fingerprint image recognition without particular structures, such as a light guide plate or a condensing lens, and the formed fingerprint image is clearer than that obtained by using a light source with the light guide plate structure.

In the display module provided in embodiments of the present disclosure, the optical fingerprint sensor 120 and the point-shaped backlight source 130 are disposed below the second substrate 112 of the self-luminous display panel, the point-shaped backlight source 130 is further disposed below the optical fingerprint sensor 120, the self-luminous display panel is provided with a non-opaque region, and the optical fingerprint sensor 120 is also provided with a non-opaque region. Therefore, after passing obliquely upward through the optical fingerprint sensor 120, the light emitted from the point-shaped backlight source 130 passes back and forth through the self-luminous display panel and returns back to be received by the optical fingerprint sensor 120, so as to realize fingerprint image acquisition. Besides, the acquired fingerprint images are clear, which makes the display module be integrated with a good fingerprint recognition function.

In the display module provided in embodiments of the present disclosure, fingerprint images are acquired in a display area of the display module by disposing the optical fingerprint sensor below a self-luminous display panel (OLED display panel) and employing a corresponding using method, so as to reduce a size of an electronic product which applies the display panel, increase a proportion of a screen of the electronic product, and improve aesthetic appearance of the electronic product (for example, increase a proportion of a screen of a mobile phone and improve aesthetic appearance of the mobile phone).

In an embodiment of the present disclosure, a method for using a display module is provided, where the display module is provided by the above embodiments and can be referred to FIG. 1. From the above embodiments, the display module includes a self-luminous display panel, an optical fingerprint sensor 120 and a point-shaped backlight source 130. The self-luminous display panel includes a first substrate 111, a second substrate 112 and a self-luminous circuit layer 113, the self-luminous circuit layer 113 is disposed between the first substrate 111 and the second substrate 112, and includes a plurality of display pixel units 1131, each of the plurality of display pixel units 1131 includes at least one light blocking region and at least one non-opaque region 11311, and height of the non-opaque region 11311 is equal to that of the self-luminous circuit layer 113. The optical fingerprint sensor 120 is disposed below the second substrate 112, the point-shaped backlight source 130 is disposed below the optical fingerprint sensor 120, and light emitted from the point-shaped backlight source 130 enters the optical fingerprint sensor 120 with a first incident angle which is acute. More details about structures and properties of the display module can be found in the descriptions of the above embodiments.

The method includes: defining a display area of the self-luminous display panel which faces the optical fingerprint sensor 120 as a first display area, and other display areas of the self-luminous display panel as a second display area; and when the optical fingerprint sensor 120 performs fingerprint image acquisition, controlling the first display area to stop displaying.

In some embodiments, the first display area is disposed to make the light pass through the self-luminous display panel successfully, so as to prevent the light emitted from the self-luminous display panel and the light emitted from the point-shaped backlight source 130 from interfering with each other. By controlling the first display area to stop displaying, fingerprint image acquisition may not be affected by the self-luminous display panel.

In some embodiments, the method may further include: when the optical fingerprint sensor 120 performs fingerprint image acquisition, controlling the second display area to display information associated with the fingerprint image acquisition. For example, "please input fingerprint in a non-display area" is displayed in the second display area. During a fingerprint input process, "input correctly" or "please input again" is displayed. When a correct fingerprint is acquired. "valid fingerprint" and other information may be displayed, or "operation is successful" and other information may be displayed according to fingerprint operations. In this way, the display function and the fingerprint recognition function may cooperate with each other to achieve better user experience.

The method may further expand an application scenario of the fingerprint recognition function. For example, before the optical fingerprint sensor starts working, the first display area displays a corresponding display icon to instruct a user to put a finger in the icon. After the user places the finger in an area where the icon is located, it is sensed that the user has placed the finger in the first display area by a touch control function owned by or set externally for the display panel, so as to control the optical fingerprint sensor to enter a working state. In this situation, a fingerprint image of the finger is acquired by the optical fingerprint sensor below the first display area to complete the fingerprint image acquisition function. The acquired fingerprint image may be further used for recognition with an existing fingerprint image stored internally or for encryption, decryption or other functions.

Figure 2:
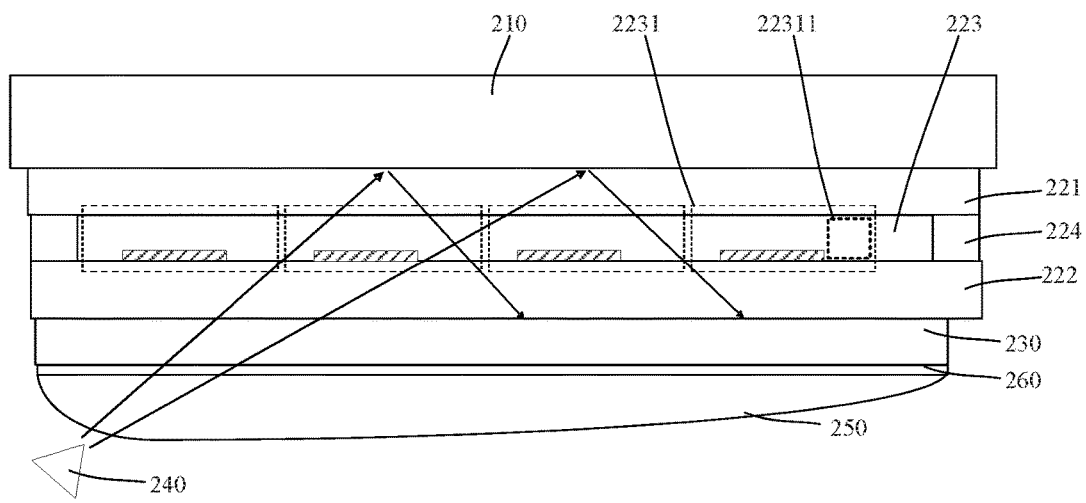
FIG. 2 schematically illustrates a sectional view of a display module according to an embodiment.

FIG. 2 schematically illustrates a sectional view of a display module according to another embodiment.

The display module includes a protective layer 210, a self-luminous display panel (not shown), an optical fingerprint sensor 230 and a point-shaped backlight source 240.

The self-luminous display panel includes a first substrate 221, a second substrate 222 and a self-luminous circuit layer 223. The self-luminous circuit layver 223 is disposed between the first substrate 221 and the second substrate 222. The self-luminous display panel further includes a sealing structure 224 which is also disposed between the first substrate 221 and the second substrate 222. The sealing structure 224 keeps the self-luminous circuit layer 223 to be sealed between the first substrate 221 and the second substrate 222.

In the display module, the protective layer 210 is disposed on the first substrate 221. Different from FIG. 1 where the first substrate 111 is directly used as a structure for finger touch, in the embodiment, the protective layer 210 is used as a structure for finger touch, and the protective layer 210 can also protect the self-luminous display panel, the optical fingerprint sensor 230, the point-shaped backlight source 240 and other structures.

In some embodiments, the protective layer 210 is a single-layer structure, that is, the protective layer 210 may be a substrate, as shown in FIG. 2. In some embodiments, the protective layer may be a multi-layer structure.

In some embodiments, the first substrate 221 and the second substrate 222 may include a non-opaque material.

The self-luminous circuit layer 223 includes a plurality of display pixel units 2231 (in FIG. 2, relations between the display pixel units 2231 are shown with dotted boxes). Each of the plurality of display pixel units 2231 includes at least one light blocking region and at least one non-opaque region 22311. One non-opaque region 22311 is shown in FIG. 2 (an area where one non-opaque region 22311 is disposed is shown as an area enclosed by the smallest dotted box in FIG. 2).

In some embodiments, the self-luminous display panel is an OLED display panel. Details can be found in the descriptions of the above embodiments of FIG. 1.

In some embodiments, height of the non-opaque region 22311 is equal to height of the self-luminous circuit layer 223, as shown in FIG. 2, so as to ensure that light can pass through the self-luminous circuit layer 223 from the non-opaque region 22311, which ensures that the display module can acquire fingerprint images.

Detailed structures of the display pixel units 2231 can be found in the descriptions of the above embodiments of FIG. 1.

Referring to FIG. 2, the optical fingerprint sensor 230 is disposed below the second substrate 222. That is, the optical fingerprint sensor 230 is disposed below the self-luminous display panel.

Referring to FIG. 2, the optical fingerprint sensor 230 includes a fingerprint sensing circuit layer (not shown) and a third substrate (not shown). In some embodiments, the fingerprint sensing circuit layer is disposed between the second substrate 222 and the third substrate. Details can be found in the descriptions of the above embodiments of FIG. 1.

The fingerprint sensing circuit layer of the optical fingerprint sensor 230 includes a plurality of photosensitive pixel units (not shown). More detailed structures can be found in the descriptions of the above embodiments of FIG. 1.

In some embodiments, the point-shaped backlight source 240 is disposed below the optical fingerprint sensor 230, and light emitted from the point-shaped backlight source 240 enters the optical fingerprint sensor 230 with a first incident angle which is acute, which can be referred to the descriptions of the above embodiments of FIG. 1.

By disposing the point-shaped backlight source 241) below the optical fingerprint sensor 230 and making the first incident angle be acute, reflected light for fingerprint image acquisition certainly enters the optical fingerprint sensor 230 with an oblique incident angle (i.e., radiates obliquely downward to the optical fingerprint sensor 230, details can be found in descriptions of the above embodiments of FIG. 1). Compared with a surface light source using a light guide plate, the point-shaped backlight source 240 can make the light shift towards a same direction (while light of the light guide plate is disorderly and shifts towards different directions), which avoids crosstalk of light (while the light from the light guide plate has crosstalk with each other). Besides, offsets of light at similar positions relative to the point-shaped backlight source 240 are similar, so that a relatively clear fingerprint image may be acquired. In this way, fingerprint recognition performance of the display module may be improved.

In some embodiments, the point-shaped backlight source 240 may include one LED, and light of the LED is near-ultraviolet light, purple light, blue light, green light, yellow light, red light, near-infrared light or white light.

In some embodiments, the point-shaped backlight source may include at least two LEDs which are evenly arranged below the optical fingerprint sensor, and light of the LEDs may be near-ultraviolet light, purple light, blue light, green light, yellow light, red light, near-infrared light or white light. For example, the point-shaped backlight source may include four LEDs which are evenly arranged below the optical fingerprint sensor. In this situation, although light emitted by each of the four LEDs may be non-parallel light, the four LEDs can be used at the same time to correct image distortion caused by non-parallel light. Specifically, the four LEDs may take turn to acquire images (the four LEDs acquire images respectively according to sequences). Afterwards, image processing is performed to do distortion correction, so as to improve quality of fingerprint images and accuracy of fingerprint recognition. In some embodiments, when the point-shaped backlight source includes a plurality of LEDs, light of any one of the LEDs may be selected as the light for fingerprint imaging during the fingerprint image acquisition, which imaging effect is similar with that of FIG. 1.

In some embodiments, a non-opaque dielectric layer 250 may be disposed below the optical fingerprint sensor 230, that is, the optical fingerprint sensor 230 is disposed between the self-luminous display panel and the non-opaque dielectric layer 250.

In some embodiments, the non-opaque dielectric layer 250 may include non-opaque adhesive. In some embodiments, the non-opaque dielectric layer 250 may include inorganic glass, organic glass or other organic non-opaque resin.

In some embodiments, a lower surface of the non-opaque dielectric layer 250 may be a light focusing surface which focuses the light emitted from the point-shaped backlight source 240 into parallel light or near-parallel light (the near-parallel light means an angular difference between light is within 10 degrees), so as to improve imaging quality of fingerprint images.

In some embodiments, the light focusing surface is an irregular curved surface. In some embodiments, the light focusing surface may be an oblique surface, a spherical cap surface, an ellipsoidal cap surface, a conic side surface or a pyramidal side surface.

The point-shaped backlight source 240) is disposed below the non-opaque dielectric layer 250. The light emitted by the point-shaped backlight source 240 passes obliquely upward through the non-opaque dielectric layer 250, and then enters the optical fingerprint sensor 230 with the first incident angle which is acute (i.e., the light first passes through the non-opaque dielectric layer 250 and then enters the optical fingerprint sensor 230).

In some embodiments, a portion of the point-shaped backlight source may be further disposed in the non-opaque dielectric layer, so that a light-emitting surface of the point-shaped backlight source is completely covered by the non-opaque dielectric layer. As the light emitted from the point-shaped backlight source directly enters the non-opaque dielectric layer, a curved surface of the non-opaque dielectric layer has no light focusing effect. In this situation, it is unnecessary to set the lower surface of the non-opaque dielectric layer to be a light focusing surface.

In some embodiments, in the display module, a light anti-reflection layer 260 is further disposed between the optical fingerprint sensor 230 and the non-opaque dielectric layer 250, to increase a proportion of the light of the point-shaped backlight source 240 which enters the optical fingerprint sensor 230. Therefore, more light may be used for fingerprint image acquisition to obtain a fingerprint image with higher definition and accuracy, so as to further improve performance of the display module.

In some embodiments, in the display module, an optical adhesive layer (not shown in FIG. 2) may be disposed between the self-luminous display panel and the optical fingerprint sensor 230, which can be referred to the descriptions of the embodiments of FIG. 1.

In some embodiments, in the display module, an optical adhesive layer (not shown in FIG. 2) may be disposed between the self-luminous display panel and the protective layer 210, and presence of the optical adhesive layer avoids air between the self-luminous display panel and the protective layer 210, so that optical performance of the display module is better.

It should be noted that, when the OLED display panel is directly laminated with the optical fingerprint sensor 230 or attached with the optical adhesive layer, a distance between the photosensitive pixel unit of the optical fingerprint sensor 230 and the upper surface of the first substrate 221 is relatively small, so as to ensure that quality of fingerprint images obtained by the fingerprint acquisition meets requirements.

In some embodiments, positions of the photosensitive pixel units in the optical fingerprint sensor 230 may correspond to positions of the display pixel units 2231 in the OLED display panel to ensure subsequent fingerprint image acquisition, which is not shown in FIG. 2. For example, one photosensitive pixel unit may correspond to four display pixel units 2231, and an area of the photosensitive pixel unit is equal to an area of four display pixel units 2231.

Theory of the display module provided in the embodiment during fingerprint acquisition is mostly the same as the theory of the embodiment of FIG. 1. Differences lie in that, before reaching the finger, the light propagates obliquely upward from the first substrate 221 to the protective layer 210, and undergoes an optical phenomenon, such as refraction and reflection, at an interface between the upper surface of the protective layer 210 and the finger, to generate reflected light which returns obliquely downward to the protective layer 210. Details of the above process may be referred to black arrows (not marked) in FIG. 2 which represent the light, where the corresponding refraction process of the light is omitted.

It should be noted that, in some embodiments, a light focusing lens may be disposed in front of a light emitting surface of the point-shaped backlight source, the light focusing lens may be capable of focusing the light emitted from the point-shaped backlight source into parallel light or near-parallel light (the near-parallel light means the difference between the angles of the light is less than 10 degrees), and the light emitted from the backlight source enters the light focusing lens and then enters the second substrate. The light focusing lens may further avoid distortion of fingerprint image.

More details about structures and advantages of the display module can be found in the above descriptions of the embodiments of FIG. 1.

In an embodiment of the present disclosure, a method for using a display module is provided, where the display module is provided by the above embodiments and can be referred to FIG. 2. From the above embodiments, the display module includes a protective layer 210, a self-luminous display panel, an optical fingerprint sensor 230 and a point-shaped backlight source 240. The self-luminous display panel includes a first substrate 221, a second substrate 222 and a self-luminous circuit layer 223, the self-luminous circuit layer 223 is disposed between the first substrate 221 and the second substrate 222, and includes a plurality of display pixel units 2231, each of the plurality of display pixel units 2231 includes at least one light blocking region and at least one non-opaque region 22311, and height of the non-opaque region 22311 is equal to that of the self-luminous circuit layer 223. The optical fingerprint sensor 230 is disposed below the second substrate 222, the point-shaped backlight source 240 is disposed below the optical fingerprint sensor 230, and light emitted from the point-shaped backlight source 240 enters the optical fingerprint sensor 230 with a first incident angle which is acute. More details about structures and properties of the display module can be found in the descriptions of the above embodiments.

In some embodiments, the method includes: defining a display area of the self-luminous display panel which faces the optical fingerprint sensor 230 as a first display area, and other display areas of the self-luminous display panel as a second display area; and when the optical fingerprint sensor 230 performs fingerprint image acquisition, controlling the first display area to stop displaying.

By controlling the first display area to stop displaying, fingerprint image acquisition may not be affected by the self-luminous display panel.

In some embodiments, the method may further include: when the optical fingerprint sensor 230 performs fingerprint image acquisition, controlling the second display area to display information associated with the fingerprint image acquisition. For example, "please input fingerprint in a non-display area" is displayed in the second display area. During a fingerprint input process, "input correctly" or "please input again" is displayed. When a correct fingerprint is acquired, "valid fingerprint" and other information may be displayed, or "operation is successful" and other information may be displayed according to fingerprint operations. In this way, the display function and the fingerprint recognition function may cooperate with each other to achieve better user experience.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A display module, comprising:
a self-luminous display panel which comprises a first substrate, a second substrate and a self-luminous circuit layer, wherein the self-luminous circuit layer is disposed between the first substrate and the second substrate, and comprises a plurality of display pixel units,
wherein each of the plurality of display pixel units comprises at least one light blocking region and at least one non-opaque region,
wherein the display module further comprises:
an optical fingerprint sensor disposed below the second substrate, wherein the optical fingerprint sensor comprises a fingerprint sensing circuit layer and a third substrate, the third substrate comprises a non-opaque material, the fingerprint sensing circuit layer comprises a plurality of photosensitive pixel units, and each of the plurality of photosensitive pixel units comprises a non-opaque region and a light blocking region in which a photosensitive element of the photosensitive pixel unit is disposed; and
a point-shaped backlight source disposed below the optical fingerprint sensor, wherein light emitted from the point-shaped backlight source enters the optical fingerprint sensor with a first incident angle which is acute.

2. The display module according to claim 1, wherein the display module further comprises a protective layer disposed on the first substrate.

3. The display module according to claim 2, wherein an optical adhesive layer is disposed between the self-luminous display panel and the optical fingerprint sensor, or an optical adhesive layer is disposed between the self-luminous display panel and the protective layer.

4. The display module according to claim 2, wherein a light anti-reflection layer is disposed below the second substrate.

5. The display module according to claim 2, wherein a non-opaque dielectric layer is disposed between the optical fingerprint sensor and the point-shaped backlight source, and the light emitted from the point-shaped backlight source enters the non-opaque dielectric layer and then enters the optical fingerprint sensor.

6. The display module according to claim 2, wherein a light focusing lens is disposed in front of a light emitting surface of the point-shaped backlight source, the light focusing lens is capable of focusing the light emitted from the point-shaped backlight source into parallel light or near-parallel light, and the light emitted from the backlight source enters the light focusing lens and then enters the optical fingerprint sensor.

7. The display module according to claim 2, wherein the point-shaped backlight source comprises one Light Emitting Diode (LED), and light of the LED is near-ultraviolet light, purple light, blue light, green light, yellow light, red light, near-infrared light or white light; or, the point-shaped backlight source comprises at least two LEDs which are evenly arranged below the optical fingerprint sensor, and light of the LEDs is near-ultraviolet light, purple light, blue light, green light, yellow light, red light, near-infrared light or white light.

8. The display module according to claim 1, wherein a light anti-reflection layer is disposed below the second substrate.

9. The display module according to claim 1, wherein a non-opaque dielectric layer is disposed between the optical fingerprint sensor and the point-shaped backlight source, and the light emitted from the point-shaped backlight source enters the non-opaque dielectric layer and then enters the optical fingerprint sensor.

10. The display module according to claim 9, wherein a lower surface of the non-opaque dielectric layer is a light focusing surface, and the light emitted from the point-shaped backlight source enters the non-opaque dielectric layer from the light focusing surface which focuses the light emitted from the point-shaped backlight source into parallel light or near-parallel light.

11. The display module according to claim 1, wherein a light focusing lens is disposed in front of a light emitting surface of the point-shaped backlight source, the light focusing lens is capable of focusing the light emitted from the point-shaped backlight source into parallel light or near-parallel light, and the light emitted from the backlight source enters the light focusing lens and then enters the optical fingerprint sensor.

12. The display module according to claim 1, wherein the point-shaped backlight source comprises one Light Emitting Diode (LED), and light of the LED is near-ultraviolet light, purple light, blue light, green light, yellow light, red light, near-infrared light or white light; or, the point-shaped backlight source comprises at least two LEDs which are evenly arranged below the optical fingerprint sensor, and light of the LEDs is near-ultraviolet light, purple light, blue light, green light, yellow light, red light, near-infrared light or white light.

13. A method for using a display module,
wherein the display module comprises a self-luminous display panel, an optical fingerprint sensor and a point-shaped backlight source, wherein the self-luminous display panel comprises a first substrate, a second substrate and a self-luminous circuit layer, the self-luminous circuit layer is disposed between the first substrate and the second substrate, and comprises a plurality of display pixel units, each of the plurality of display pixel units comprises at least one light blocking region and at least one non-opaque region, the optical fingerprint sensor is disposed below the second substrate, and comprises a fingerprint sensing circuit layer and a third substrate, the third substrate comprises a non-opaque material, the fingerprint sensing circuit layer comprises a plurality of photosensitive pixel units, each of the plurality of photosensitive pixel units comprises a non-opaque region and a light blocking region in which a photosensitive element of the photosensitive pixel unit is disposed, the point-shaped backlight source is disposed below the optical fingerprint sensor, and light emitted from the point-shaped backlight source enters the optical fingerprint sensor with a first incident angle which is acute,
wherein the method comprises: defining a display area of the self-luminous display panel which faces the optical fingerprint sensor as a first display area, and other display areas of the self-luminous display panel as a second display area; and when the optical fingerprint sensor performs fingerprint image acquisition, controlling the first display area to stop displaying.

14. The method according to claim 13, further comprising: when the optical fingerprint sensor performs fingerprint image acquisition, controlling the second display area to display information associated with the fingerprint image acquisition.

* * * * *